United States Patent
Rohwer

(10) Patent No.: US 6,496,876 B1
(45) Date of Patent: Dec. 17, 2002

(54) SYSTEM AND METHOD FOR STORING A TAG TO IDENTIFY A FUNCTIONAL STORAGE LOCATION IN A MEMORY DEVICE

(75) Inventor: Paul W. Rohwer, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/217,781

(22) Filed: Dec. 21, 1998

(51) Int. Cl.[7] .......................... G06F 3/00; G06F 12/00; H02H 3/05; G11C 29/00

(52) U.S. Cl. ..................... 710/3; 714/54; 714/763; 711/103; 711/170

(58) Field of Search ................. 711/103, 170; 714/763, 54; 710/3

(56) References Cited

U.S. PATENT DOCUMENTS

| | | | |
|---|---|---|---|
| 3,714,637 A | 1/1973 | Beausoleil | 340/173 R |
| 3,715,735 A | 2/1973 | Moss | 340/173 R |
| 3,735,368 A | 5/1973 | Beausoleil | 340/173 R |
| 3,772,652 A | 11/1973 | Hilberg | 340/172.5 |
| 3,781,826 A | 12/1973 | Beausoleil | 340/173 R |
| 3,800,294 A | 3/1974 | Lawlor | 340/172.5 |
| 3,845,476 A | 10/1974 | Boehm | 340/173 BB |
| 4,355,376 A | 10/1982 | Gould | 365/200 |
| 4,376,300 A | 3/1983 | Tsang | 365/200 |
| 4,450,560 A | 5/1984 | Conner | 371/25 |
| 4,475,194 A | 10/1984 | Lavallee et al. | 371/10 |
| 4,479,214 A | 10/1984 | Ryan | 371/11 |
| 4,493,075 A | 1/1985 | Anderson et al. | 371/10 |
| 4,527,251 A | 7/1985 | Nibby, Jr. et al. | 364/900 |
| 4,646,299 A | 2/1987 | Schinabeck et al. | 371/20 |
| 4,656,532 A * | 4/1987 | Greenberg et al. | 360/48 |
| 4,807,191 A | 2/1989 | Flannagan | 365/189 |
| 4,837,747 A | 6/1989 | Dosaka et al. | 371/10 |
| 4,876,685 A | 10/1989 | Rich | 371/21.6 |
| 4,881,200 A | 11/1989 | Urai | 365/189.04 |
| 4,908,798 A | 3/1990 | Urai | 365/230.03 |
| 4,918,662 A | 4/1990 | Kondo | 365/210 |
| 4,935,899 A | 6/1990 | Morigami | 365/200 |
| 4,992,984 A | 2/1991 | Busch et al. | 365/200 |
| 5,051,994 A | 9/1991 | Bluethman et al. | 371/11.1 |
| 5,060,197 A | 10/1991 | Park et al. | 365/200 |
| 5,124,948 A | 6/1992 | Takizawa et al. | 365/200 |
| 5,126,973 A | 6/1992 | Gallia et al. | 365/200 |
| 5,134,584 A | 7/1992 | Boler et al. | 365/200 |
| 5,200,959 A | 4/1993 | Gross et al. | 371/21.6 |
| 5,208,775 A | 5/1993 | Lee | 365/200 |
| 5,233,614 A | 8/1993 | Singh | 371/21.6 |
| 5,243,570 A | 9/1993 | Saruwatari | 365/201 |

(List continued on next page.)

FOREIGN PATENT DOCUMENTS

| JP | 363129563 A | * | 6/1988 |
|---|---|---|---|
| JP | 363149879 A | * | 6/1988 |

OTHER PUBLICATIONS

U.S. patent application Ser. No. 08/903,819, filed, Jul. 31, 1997, entitled System for Remapping Defective Memory Bit Sets.

(List continued on next page.)

Primary Examiner—Thomas Lee
Assistant Examiner—Chun Cao
(74) Attorney, Agent, or Firm—Trop, Pruner & Hu, P.C.

(57) ABSTRACT

Dysfunctional storage locations in a memory device may be demarcated by identifying a first and second dysfunctional storage location in the memory device, and storing a first tag before the first identified storage location, the first tag indicating a storage location immediately after the second identified storage location. A second tag may be used to demarcate functional storage locations by identify a functional storage location, and storing a second tag at the identified functional storage location, the second tag indicating a storage location immediately preceding the first identified dysfunctional storage location.

31 Claims, 6 Drawing Sheets

U.S. PATENT DOCUMENTS

| | | | | |
|---|---|---|---|---|
| 5,251,174 | A | 10/1993 | Hwang | 365/200 |
| 5,268,866 | A | 12/1993 | Feng et al. | 365/200 |
| 5,270,974 | A | 12/1993 | Reddy | 365/200 |
| 5,270,976 | A | 12/1993 | Tran | 365/200 |
| 5,315,552 | A | 5/1994 | Yoneda | 365/200 |
| 5,327,380 | A | 7/1994 | Kersh, III et al. | 365/195 |
| 5,331,188 | A | 7/1994 | Acovic et al. | 257/298 |
| 5,332,922 | A | 7/1994 | Oguchi et al. | 257/723 |
| 5,337,277 | A | 8/1994 | Jang | 365/200 |
| 5,349,556 | A | 9/1994 | Lee | 365/200 |
| 5,371,866 | A | 12/1994 | Cady | 395/400 |
| 5,379,415 | A | 1/1995 | Papenberg et al. | 395/575 |
| 5,390,129 | A | 2/1995 | Rhodes | 364/480 |
| 5,392,247 | A | 2/1995 | Fujita | 365/200 |
| 5,400,263 | A | 3/1995 | Rohrbaugh et al. | 364/490 |
| 5,400,342 | A | 3/1995 | Matsumura et al. | 371/21.2 |
| 5,406,565 | A | 4/1995 | MacDonald | 371/10.3 |
| 5,410,545 | A | 4/1995 | Porter et al. | 371/21.6 |
| 5,424,989 | A | 6/1995 | Hagiwara et al. | 365/201 |
| 5,434,792 | A | 7/1995 | Saka et al. | 364/468 |
| 5,442,638 | A * | 8/1995 | Awad et al. | 714/6 |
| 5,465,234 | A | 11/1995 | Hannai | 365/200 |
| 5,469,390 | A | 11/1995 | Sasaki et al. | 365/200 |
| 5,475,648 | A | 12/1995 | Fujiwara | 365/230.06 |
| 5,475,695 | A | 12/1995 | Caywood et al. | 371/27 |
| 5,491,664 | A | 2/1996 | Phelan | 365/200 |
| 5,497,381 | A | 3/1996 | O'Donoghue et al. | 371/28 |
| 5,502,333 | A | 3/1996 | Bertin et al. | 257/685 |
| 5,513,135 | A | 4/1996 | Dell et al. | 365/52 |
| 5,513,327 | A | 4/1996 | Farmwald et al. | 395/309 |
| 5,528,553 | A | 6/1996 | Saxena | 365/230.01 |
| 5,535,328 | A | 7/1996 | Harari et al. | 395/182.05 |
| 5,538,115 | A | 7/1996 | Koch | 188/299 |
| 5,539,697 | A | 7/1996 | Kim et al. | 365/200 |
| 5,544,106 | A | 8/1996 | Koike | 365/200 |
| 5,548,553 | A | 8/1996 | Cooper et al. | 365/200 |
| 5,553,231 | A | 9/1996 | Papenberg et al. | 395/182.03 |
| 5,576,999 | A | 11/1996 | Kim et al. | 365/200 |
| 5,588,115 | A | 12/1996 | Augarten | 395/183.05 |
| 5,600,258 | A | 2/1997 | Graham et al. | 324/758 |
| 5,602,987 | A | 2/1997 | Harari et al. | 395/182.06 |
| 5,631,868 | A | 5/1997 | Termullo, Jr. et al. | 365/200 |
| 5,633,826 | A | 5/1997 | Tsukada | 365/200 |
| 5,636,173 | A | 6/1997 | Schaefer | 365/230.03 |
| 5,654,204 | A | 8/1997 | Anderson | 438/15 |
| 5,668,763 | A | 9/1997 | Fujioka et al. | 365/200 |
| 5,677,883 | A * | 10/1997 | Miwa | 365/200 |
| 5,717,694 | A | 2/1998 | Ohsawa | 371/5.1 |
| 5,734,621 | A | 3/1998 | Ito | 365/230.03 |
| 5,745,673 | A | 4/1998 | Di Zenzo et al. | 395/182.05 |
| 5,754,753 | A | 5/1998 | Smelser | 395/182.06 |
| 5,758,056 | A | 5/1998 | Barr | 395/182.05 |
| 5,768,173 | A | 6/1998 | Seo et al. | 365/52 |
| 5,798,962 | A | 8/1998 | Di Zenzo et al. | 365/52 |
| 5,841,710 | A | 11/1998 | Larsen | 365/200 |
| 5,844,911 | A * | 12/1998 | Schadegg et al. | 714/710 |
| 5,848,438 | A * | 12/1998 | Nemazie et al. | 711/201 |
| 5,862,314 | A | 1/1999 | Jeddeloh | 395/182.06 |
| 5,896,346 | A | 4/1999 | Dell et al. | 365/233 |
| 5,913,020 | A | 6/1999 | Rohwer | 395/182.06 |
| 5,920,512 | A | 7/1999 | Larsen | 365/200 |
| 5,920,513 | A | 7/1999 | Jacobson | 365/200 |
| 5,943,179 | A * | 8/1999 | Fukushima | 360/77.04 |
| 5,956,233 | A | 9/1999 | Yew et al. | 361/760 |
| 5,963,463 | A | 10/1999 | Rondeau, II et al. | 365/52 |
| 5,966,724 | A | 10/1999 | Ryan | 711/105 |
| 5,970,008 | A | 10/1999 | Zagar et al. | 365/226 |
| 5,974,564 | A | 10/1999 | Jeddeloh | 714/8 |
| 5,991,215 | A | 11/1999 | Brunelle | 365/201 |
| 5,995,409 | A | 11/1999 | Holland | 365/149 |
| 5,996,096 | A | 11/1999 | Dell et al. | 714/710 |
| 6,009,536 | A | 12/1999 | Rohwer | 714/8 |
| 6,058,085 | A * | 5/2000 | Obata | 369/54 |
| 6,092,195 | A * | 7/2000 | Nguyen | 713/200 |
| 6,101,619 | A * | 8/2000 | Shin | 714/710 |
| 6,108,797 | A * | 8/2000 | Lin et al. | 714/8 |
| 6,141,768 | A * | 10/2000 | Lin et al. | 714/8 |
| 6,195,299 | B1 * | 2/2001 | Sugibayashi | 365/200 |
| 6,212,648 | B1 * | 4/2001 | Abe | 714/8 |
| 6,286,061 | B1 * | 9/2001 | Ross | 710/33 |
| 6,336,202 | B1 * | 1/2002 | Tsuchimoto et al. | 714/768 |

OTHER PUBLICATIONS

U.S. patent application Ser. No. 09/035,629, filed Mar. 5, 1998, entitled "Recovery of Useful Areas of Partially Defective Synchronous Memory Components".

U.S. patent application Ser. No. 09/067,347, filed Apr. 28, 1998, entitled "A System for Decoding Addresses for a Defective Memory Array".

U.S. patent application Ser. No. 09/067,467, filed Apr. 28, 1998, entitled "A Method for Decoding Addresses for a Defective Memory Array".

U.S. patent application Ser. No. 09/519,641, filed Mar. 6, 2000, entitled "Method and Apparatus for Recovery of Useful Areas of Partially Defective Direct Rambus Rimm Components".

U.S. patent application Ser. No. 09/548,826, filed Apr. 13, 2000, entitled "Method and Apparatus for Storing Failing Part Locations in a Module".

U.S. patent application Ser. No. 09/035,739, filed Mar. 5, 1998, entitled "Method for Recovery of Useful Areas of Partially Defective Synchronous Memory Components".

Shanley et al., "ISA System Architecture", Third Edition, MindShare, Inc., Feb. 1995.

"PC SDRAM Specification", Revision 1.63, Intel Corporation, Oct. 1998.

"PC SDRAM Unbufered DIMM Specification", Revision 1.0, Intel Corporation, Feb. 1998.

* cited by examiner

SYSTEM AND METHOD FOR STORING A TAG TO IDENTIFY A FUNCTIONAL STORAGE LOCATION IN A MEMORY DEVICE

BACKGROUND

The invention relates generally to the use of partially defective memory devices and, in particular, to the use of partially defective random access memory (RAM) devices.

Not all applications that use computer memory devices require those devices to provide absolute store-and-retrieve fidelity. For example, applications such as telephone answering machines, some video storage devices, and toys may use memory devices that have one or more non-functional memory locations. Systems such as these may use a memory interface device to identify and map out those blocks of memory having one or more defective locations. Referring to FIG. 1, a system 100 capable of using partially defective memory 102 may also include application 104 (e.g., an audio or video storage application), interface 106 through which application 104 communicates with memory 102, and input-output (I/O) unit 108 through which application 104 communicates with external units or users.

In one prior art technique, interface 106 may generate a table whose entries identify blocks within memory 102 that have one or more defective locations. A block of memory may be a specified number of memory locations, for example, 256 bits, 64 nibbles, 128 bytes, or 64 words. Referring to FIG. 2, interface 106 may write a known pattern (e.g., the zero value) to every location in memory 102 (at 200). Next, a block of memory 102 may be read (at 202) and inspected (at 204). If every location retrieved at 202 reflects the pattern written at 200 (the 'yes' prong at 204), a table entry is generated that identifies the block of memory as valid (at 206). If every location retrieved at 202 does not match the pattern written at 200 (the 'no' prong at 204), a table entry is generated that identifies the entire block of memory as invalid (at 208). If, after creating a table entry at 206 or 208, the entire memory has been inspected (the 'yes' prong at 210), processing terminates (at 212). If, after creating a table entry at 206 or 208, the entire memory has not been inspected (the 'no' prong at 210), processing continues at 202. During subsequent operations, interface 106 may read information from and write information to memory 102 while skipping those blocks identified in the table as invalid. A table created in accordance with FIG. 1 may be generated upon system 100 power-up/reset, or once during the manufacture and testing process. Further, the table may be stored in volatile memory such as RAM or nonvolatile memory such as programmable read only memory (PROM), electrically erasable programmable read only memory (EEPROM), or FLASH type memory.

In another prior art technique, interface 106 may write a pattern to memory 102 indicating whether a block is valid/functional or invalid/nonfunctional. Referring to FIG. 3, interface 106 may write a known pattern (e.g., the zero value) to every location in memory 102 (at 300). Memory 102 may then be read back a block at a time (at 302) and inspected (at 304). If every location retrieved at 302 reflects the pattern written at 300 (the 'yes' prong at 304), each location in that block of memory is written with a specified pattern indicating it as valid memory (at 306). If every location retrieved at 302 does not match the pattern written at 300 (the 'no' prong at 304), each location in that block of memory is written with a specified pattern indicating it as invalid memory (at 308). If, after storing a pattern to memory at 306 or 308, the entire memory has been inspected (the 'yes' prong at 310), processing terminates (at 312). If, after storing a pattern to memory at 306 or 308, the entire memory has not been inspected (the 'no' prong at 310), processing continues at 302. During subsequent operations, interface 106 may read information from and write information to memory 102 by skipping over those blocks marked as invalid.

Current techniques to incorporate partially dysfunctional memory devices into a system include or exclude entire blocks of memory. Because the cost of memory is becoming increasingly important in driving the cost of finished products such as telephone answering machines, video storage devices, and toys, it would be beneficial to provide a mechanism that allows more of a partially dysfunctional memory device to be used.

SUMMARY

In one embodiment, the invention provides a method to demarcate regions of dysfunctional storage locations in a memory device. The method includes identifying a first and a second dysfunctional storage location in the memory device, and storing a first tag before the first storage location, the first tag indicating a storage location immediately after the second storage location.

In another embodiment, the invention also provides a method to demarcate functional regions of storage locations by identifying a functional storage location, and storing a second tag at the identified functional storage location, the second tag indicating a storage location immediately preceding the first identified dysfunctional storage location.

Methods in accordance with the invention may be stored in any media that is readable and executable by a programmable control device such as, for example, a microprocessor or custom designed state machine.

BRIEF DESCRIPTION OF THE INVENTION

DETAILED DESCRIPTION

Techniques (including methods and devices) to map out those locations in a memory device determined to be faulty are described. Illustrative systems where such a technique may be beneficial include, but are not limited to, audio applications such as telephone answering machines and toys and video storage devices such as video disks. The following embodiments of this inventive concept are illustrative only and are not to be considered limiting in any respect.

Figure 1:
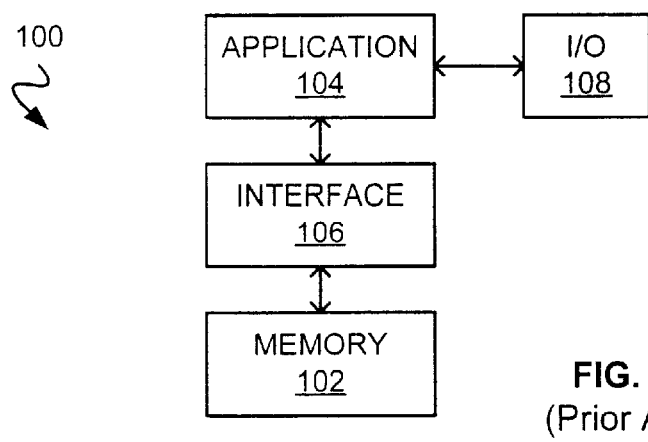
FIG. 1 shows a prior art system that may use partially defective memory devices.
Figure 2:
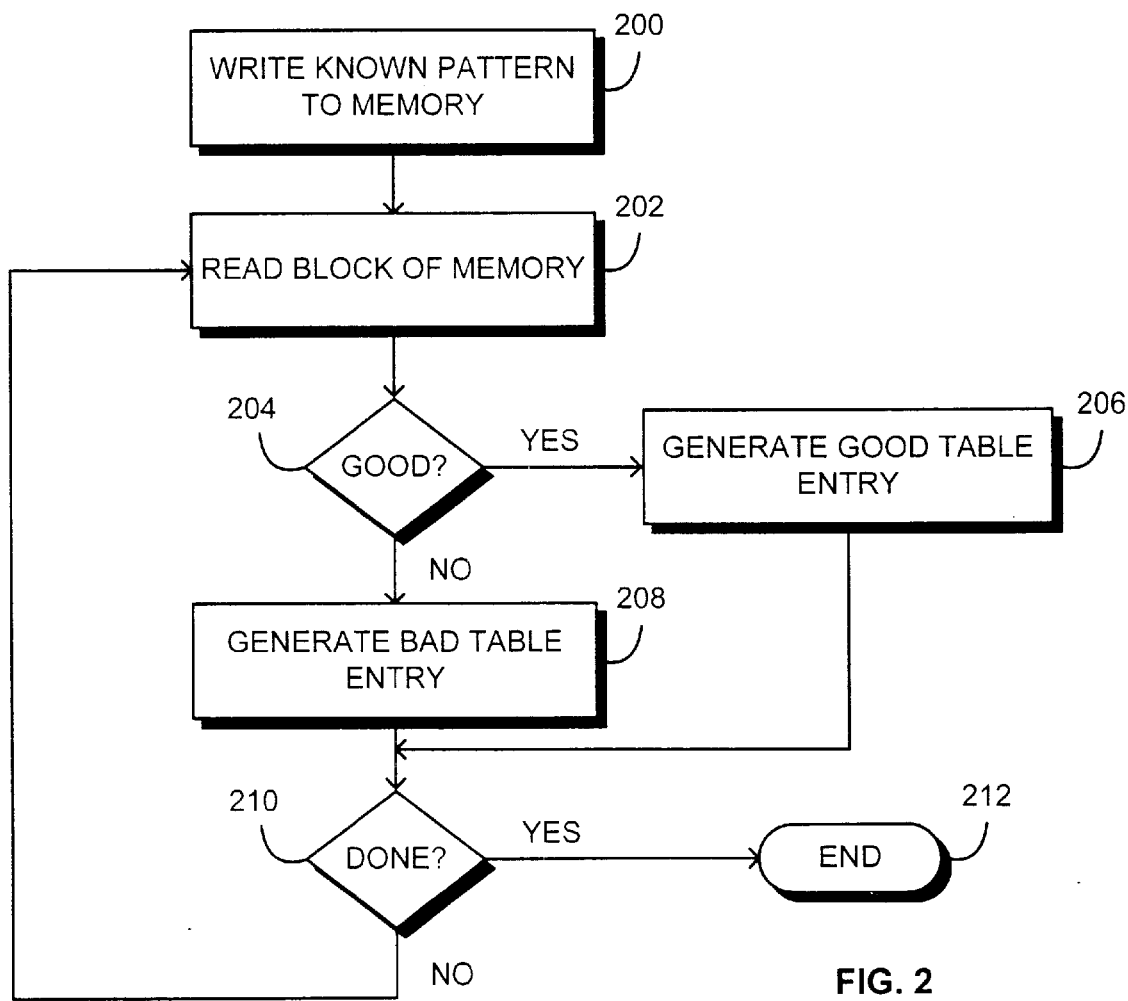
FIG. 2 shows one prior art method to identify blocks within a memory device that include defective storage locations.
Figure 3:
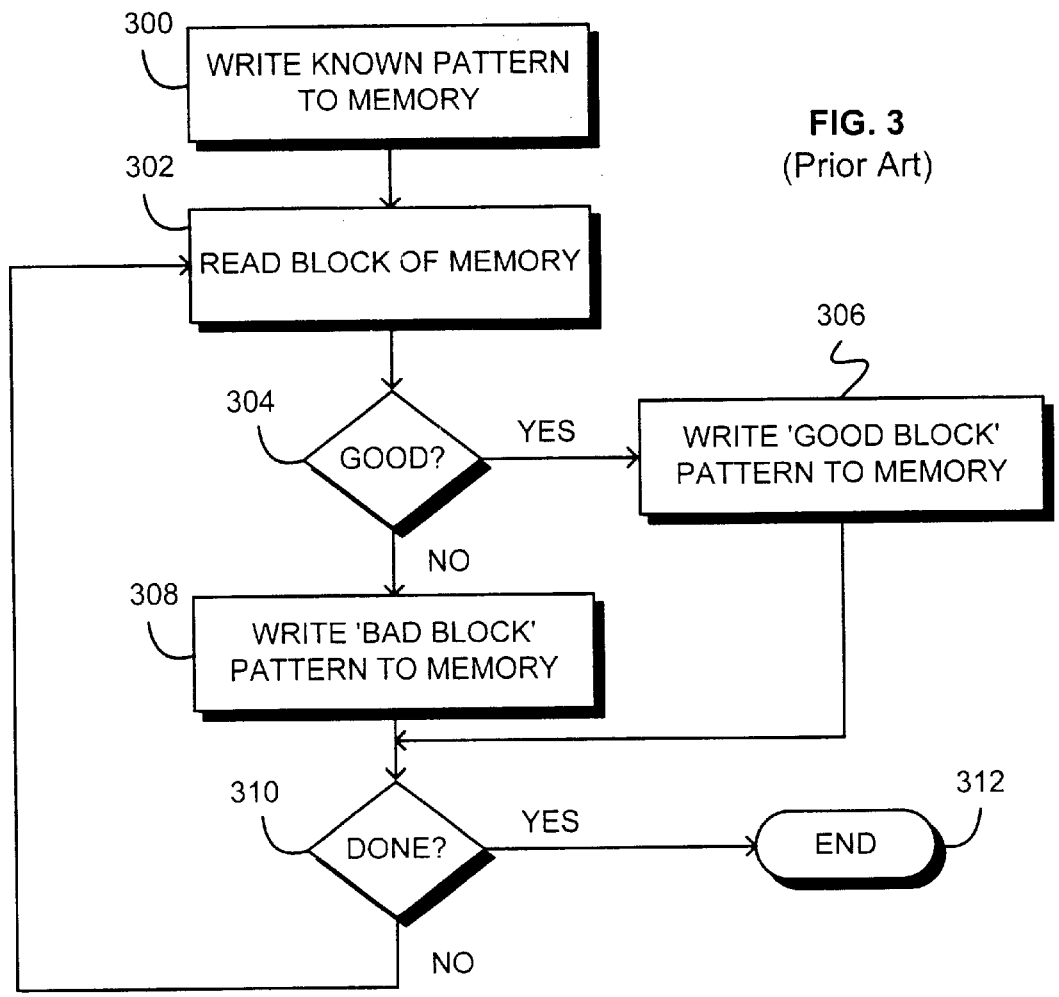
FIG. 3 shows another prior art method that identifies blocks within a memory device that include defective storage locations.
Figure 4:
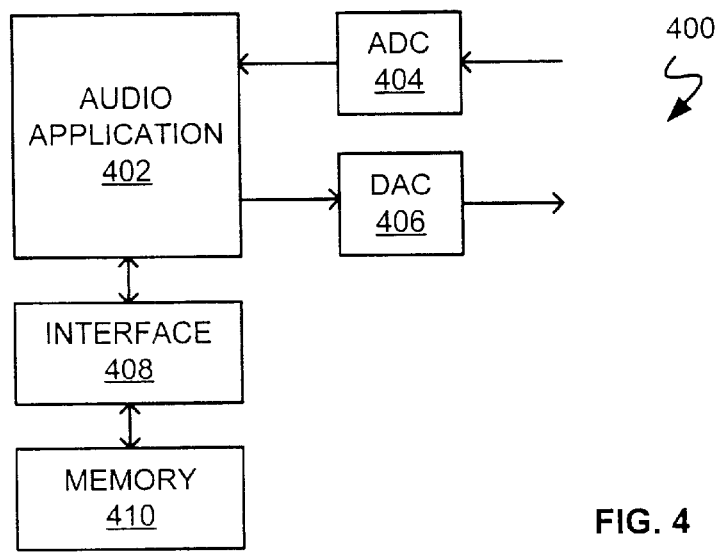
FIG. 4 shows a system in accordance with one embodiment of the invention.

Referring to FIG. 4, a system 400 in accordance with one embodiment of the invention includes audio application 402, analog to digital (ADC) 404 and digital to analog (DAC) 406 converters, memory interface unit 408, and audio random access memory (ARAM) 410. Audio application 402 may include a combination of hardware and software needed to implement the target application. For example, if the target application is a telephone answering device, audio application 402 may include a microprocessor, programmable microcontroller, or a custom designed state machine to implement the desired answering machine functions. Analog to digital converter 404 provides a mechanism for externally generated sound (e.g., a voice) to be changed to a digital format for processing and/or storage in system 400. Similarly, DAC 406 provides a mechanism for digitally generated and/or stored information to be converted to analog format for external presentation. Interface 408 provides a mechanism for interfacing application 402 to memory 410. For example, interface 408 may include a Z8 microcontroller manufactured by the Zilog corporation. In one embodiment memory 410 includes two 4M×4 ARAM devices to provide a total of 4 megabytes (MB) of memory, e.g., two S4004SA1-0 memory devices sold by Micron Electronics Incorporated. One function of interface unit 408 is to present a uniform memory space to application 402, mapping out any nonfunctional memory locations in memory 410. That is, interface 408 makes any nonfunctional memory locations in memory 410 transparent to application 402.

Figure 5:
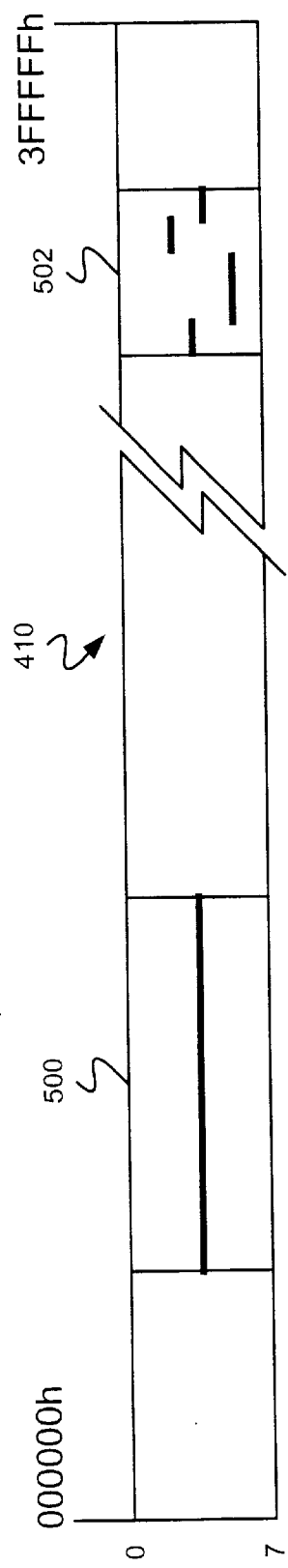
FIG. 5 illustrates a memory device having regions of nonfunctional storage elements.

Referring to FIG. 5, memory 410 may be visualized as a contiguous sequence of memory locations (each 8 bits, or 1 byte, wide) starting at 000000h (where 'h' indicates hexadecimal notation) and ending at 3FFFFFh (4×2$^{20}$ bytes or 4 MB). For illustrative purposes, memory 410 is shown as having two regions of partially dysfunctional memory locations: region 1500 and region 2 502 (dysfunctional memory locations are represented by solid horizontal black bars).

In accordance with one embodiment of the invention (see FIG. 6), interface unit 408 identifies and demarcates regions of memory 410 that include nonfunctional storage elements—storage locations (e.g., bytes) having one or more components (e.g., bits) that do not function correctly. Initially interface 408 may write a known pattern, such as the value 2Ah, to each location in memory 410 (at 600). Interface 408 may then read memory 410 (at 602), and determine if the pattern written at 600 is the same as the pattern read at 602 (at 604). If the patterns match (the 'yes' prong at 604), the memory location read at 602 is determined to be valid/functional, and processing continues at 610.

Figure 7:
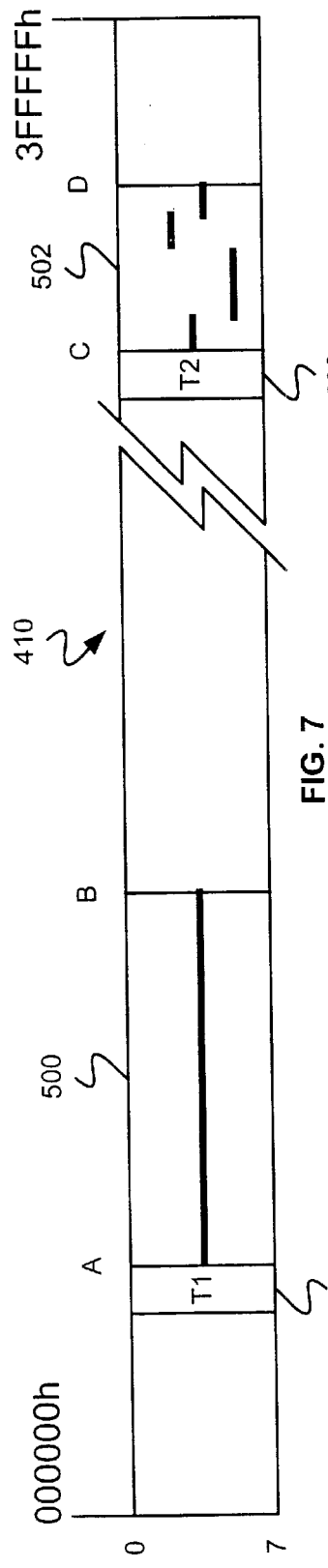
FIG. 7 illustrates a memory device having regions of nonfunctional storage elements demarcated by tags in accordance with one embodiment of the invention.

If the pattern written at 600 and read at 602 do not match (the 'no' prong at 604), interface 408 continues to read storage locations from memory 410 to determine the extent of the dysfunctional memory (at 608). Referring to FIG. 7, if the address of the first dysfunctional memory location is A, and the last dysfunctional storage location has an address of B, the extent of the dysfunctional storage locations is (B-A) and defines region 1500. With the number of dysfunctional storage locations known (at 606), interface 408 may store tag T1 700 preceding the region of bad memory (at 608), region 1500 for example.

Figure 8:
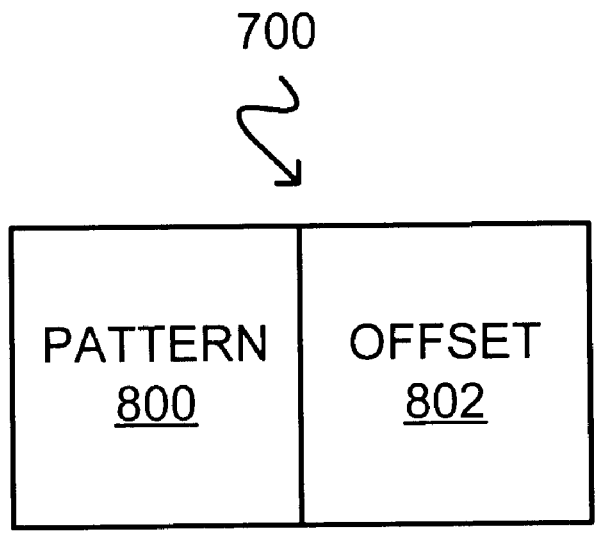
FIG. 8 shows a tag structure in accordance with one embodiment of the invention.

Referring now to FIG. 8, tag 700 may include pattern portion 800 and offset portion 802. It is beneficial if pattern portion 800 is selected to uniquely identify the combination of pattern portion 800 and offset portion 802 as a tag. For example, tag pattern portion 800 could be 32-bits represented by an 8-digit hexadecimal value, each of whose digits are not evenly divisible by two. One illustrative pattern portion 800 is 35793579h. Tag offset portion 802 may indicate the next valid storage location in memory 410. For example, offset portion 802 may "point" to storage location B+1. An illustrative offset value may be embodied in a 16-bit value, making it possible to specify offsets as large as approximately 65,000 storage locations (e.g., bytes).

Following a matched pattern at 604 or a tag insertion at 608, interface 408 determines if all of memory 410 has been inspected (at 610). If memory 410 has been inspected (the 'yes' prong at 610), processing terminates at 612. If all of memory 410 has not been inspected (the 'no' prong at 610), processing continues at 602. For example, referring again to FIG. 7, interface 408 may continue reading from memory 410 until address location C is inspected. At that point acts 606 and 608 are performed to insert tag T2 702.

As shown in FIG. 7, region 2 502 illustrates an area of memory having some non-contiguous dysfunctional storage locations. When non-contiguous dysfunctional storage locations are encountered, interface 408 may specify that if less than N contiguous storage locations are functional, the collection of storage locations are dysfunctional. That is, a dysfunctional region may be defined as that region between two sequences of functional storage locations, each of which are at least N storage locations in length. As a practical matter, it is beneficial if N is set to a value equal to the size of a tag plus the minimum useful memory region. Thus, as an example, if the smallest useable memory area (to store data for example) is 16 bytes, and a tag is 4 bytes, then N may be greater than or equal to 20.

In accordance with another embodiment of the invention (see FIG. 9), memory regions may be demarcated with multiple tags. Header tags H1 900, H2 902, and H3 904 demarcate regions of memory 410 which include fully functional storage locations. Footer tags T1 700 and T2 702 demarcate regions of memory 410 which include partially functional, or fully dysfunctional, storage locations.

Figure 10:
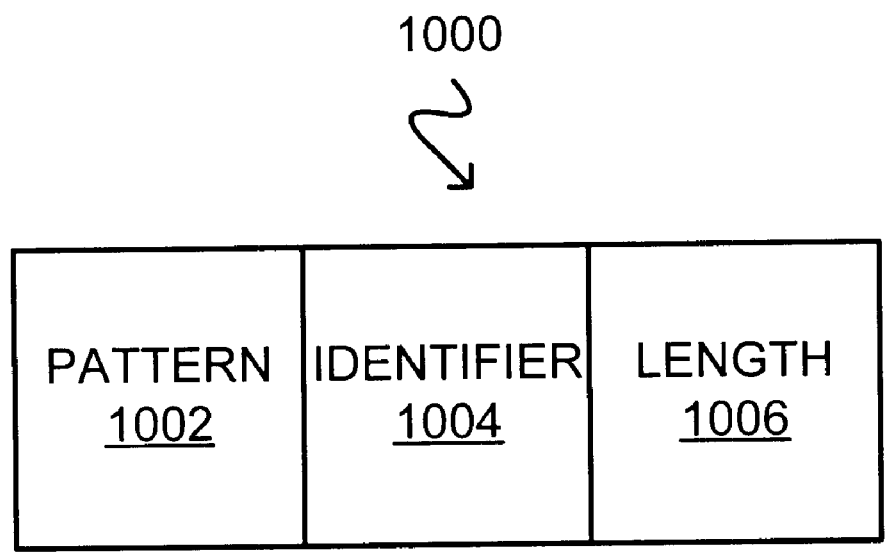
FIG. 10 shows another tag structure in accordance with one embodiment of the invention.

Referring now to FIG. 10, a header tag structure 1000 in accordance with one embodiment of the invention may include pattern portion 1002, identifier portion 1004, and length portion 1006. As in the tag structure of FIG. 8, it may be beneficial if pattern portion 1002 is selected to uniquely identify header tag structure 1000 and which is different from tag pattern portion 800. For example, pattern portion 1002 could be 32-bits represented by an 8-digit hexadecimal value, each of whose digits are not evenly divisible by two. One illustrative pattern portion 800 is 97359735h. Tag identifier portion 1004 may be used by interface 408 to identify which data is stored in the memory following the header tag. For example, identifier portion 1004 may be used by interface 408 to assist it in matching a symbolic reference for the tag's associated data (e.g., the symbol used by application 402 to identify the data). An illustrative identifier portion 1004 may be embodied in a 16-bit value. In an embodiment of the invention which utilizes identifier portion 1004, tag length portion 1006 may indicate the number of fully functional storage locations associated with a specified data item. In another embodiment of the invention which does not use identifier portion 1004 (e.g., when each valid memory region is demarcated by a single header tag), tag length portion 1006 may indicate the number of fully functional storage locations available for data storage following tag 1000 (i.e., until the next dysfunctional region or end of memory). An illustrative length portion 1006 may be embodied in a 16-bit value.

Figure 9:
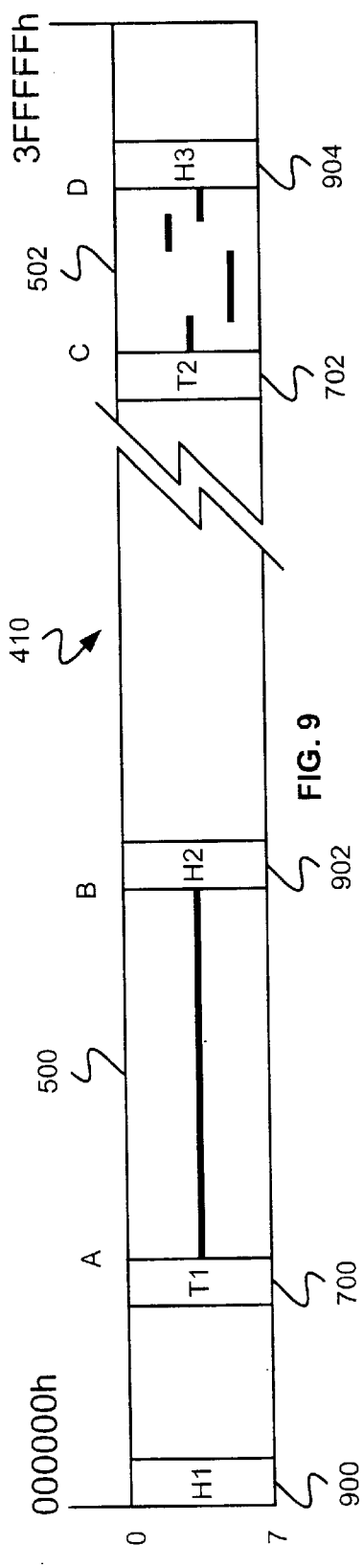
FIG. 9 illustrates a memory device having regions of nonfunctional storage elements demarcated by tags in accordance with another embodiment of the invention.
Figure 11:
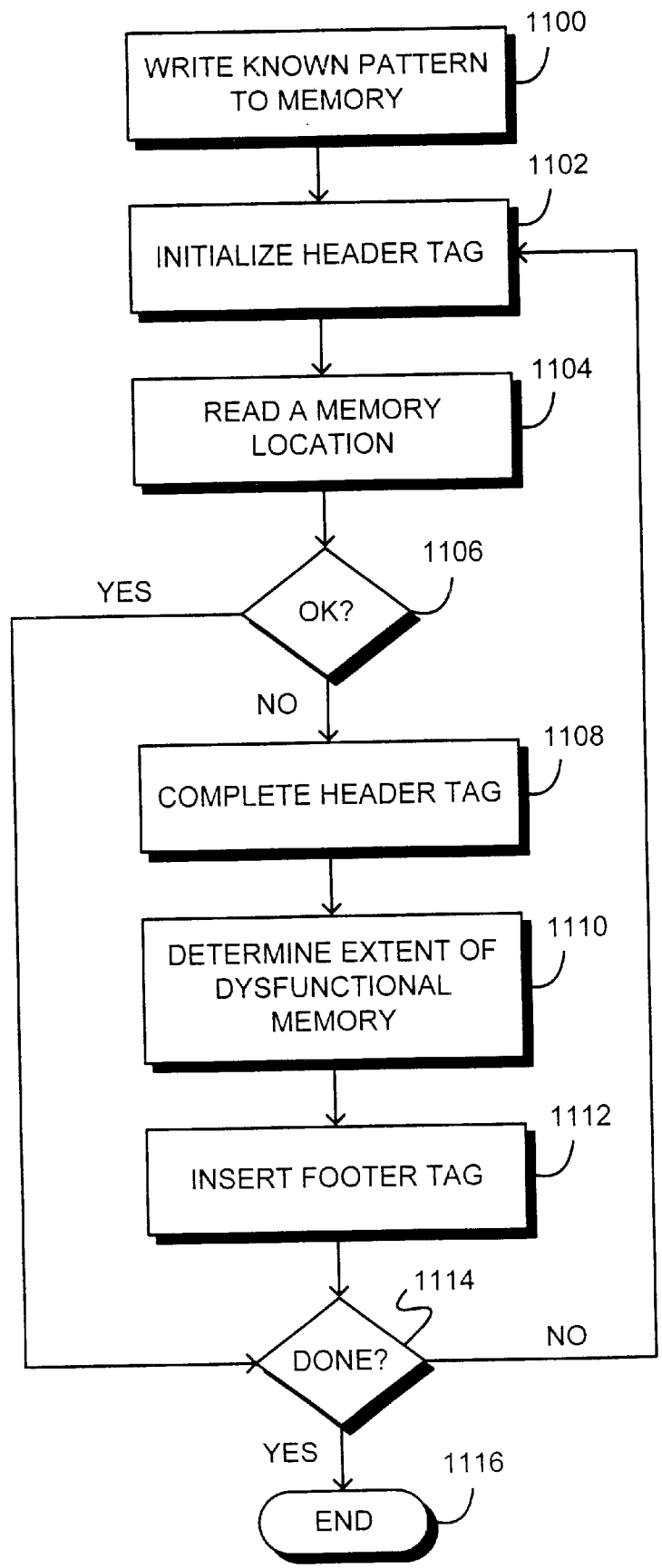
FIG. 11 shows another method to identify and demarcate memory regions in accordance with one embodiment of the invention.

One technique using header and footer tags to demarcate regions within memory 410 in accordance with FIGS. 9 and 10 is shown in FIG. 11. As before, interface 408 may initially write a known-pattern to each location in memory 410 (at 1100). Interface 408 may then initialize header tag structure 1000 at the start of memory 410 (at 1102). For example, interface 408 may write pattern portion 1002 to memory 410 and zeros' to identifier 1004 and length 1006 portions, This operation is generally possible as many ARAM devices (and other types of memory devices) guarantee the first M storage locations to be valid. For example, the S4004SA1-0 memory device sold by Micron Electronics, Incorporated guarantees that the first 16 storage locations are valid/functional. Following header tag initialization, interface 408 may read memory 410 (at 1104), and determine if the pattern written at 1100 is the same as the pattern read at 1104 (at 1106). If the two patterns match (the 'yes' prong at 1106), the memory location read at 1104 is determined to be valid/functional, and processing continues at 1114.

If the pattern written at 1100 and read at 1104 do not match (the 'no' prong at 1106), interface 408 completes the header tag structure initialized at 1102 (at 1108) by, for example, writing to the tag's length portion 1006 the extent of the valid/functional storage location. Interface 408 may then continue to read storage locations from memory 410 to determine the extent of the dysfunctional memory (at 1110). With the number of dysfunctional storage locations known, interface 408 may insert a tag structure preceding the region of bad memory (at 1112), e.g., tag T1 700 or tag T2 702 in FIG. 9. Following a matched pattern at 1106 or a tag insertion at 1112, interface 408 determines if all of memory 410 has been inspected (at 1114). If memory 410 has been inspected (the 'yes' prong at 1114), processing terminates at 1116. If all of memory 410 has not been inspected (the 'no' prong at 1114), processing continues at 1102.

In summary, those storage locations in a memory device that are partially or fully dysfunctional cannot be used for normal data storage methods such as utilized by conventional applications. Techniques in accordance with the invention "map out" failed memory locations on a region-by-region basis, where a region is defined by the extent of the dysfunctional memory. Prior art techniques, on the other hand, map out failed memory locations on a per-block basis, where a block is related to the memory's underlying physical architecture. Thus, if a memory device has a single dysfunctional storage location, prior art techniques would map out an entire block (e.g., 256 bytes). In contrast, a method in accordance with the invention may map only out the one faulty location while also consuming a minimal amount of additional memory for a tag structure (or two tag structures if both a header and footer tag embodiment is used). Thus, techniques in accordance with the invention effectively increase the amount of memory available to a system (e.g., an application and/or memory interface) for data storage over prior art techniques.

Various changes in the materials, components, circuit elements, as well as in the details of the illustrated operational methods are possible without departing from the scope of the claims. For instance, the invention is not limited to audio or video applications—the invention may be used with any application that uses memory. For example, partially dysfunctional high speed memory devices may be used in accordance with the invention in a system that can tolerate a less than maximum data transfer rate from memory (to accommodate the overhead of "skipping over" dysfunctional storage locations). Thus, the invention may be used in standard computer systems comprising a central processor, a main bus, a memory (e.g., system RAM), bridge circuits, and peripherals.

Figure 6:
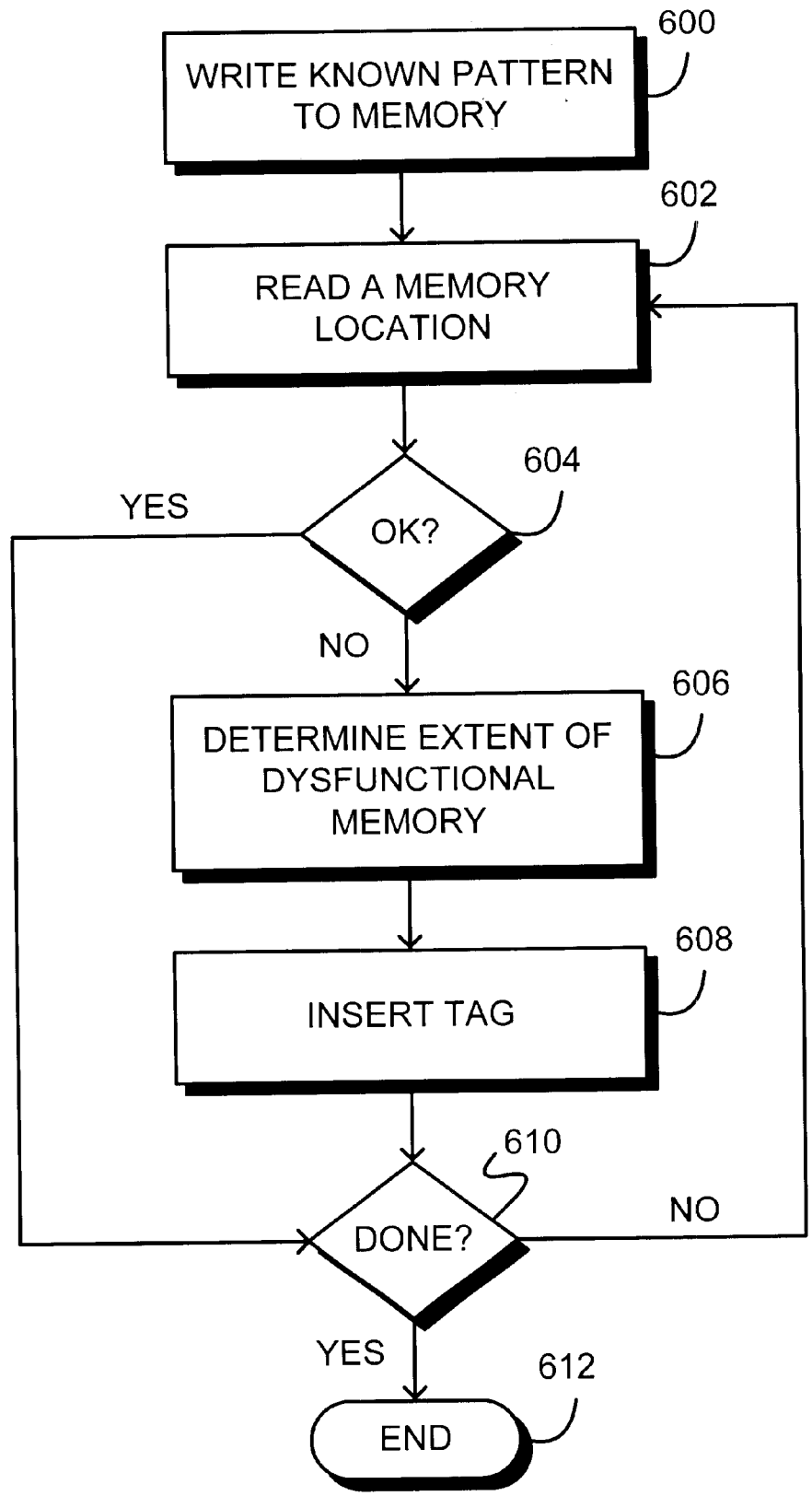
FIG. 6 shows one method in accordance with the invention to identify and demarcate memory regions having dysfunctional storage elements.

In addition, acts in accordance with FIGS. 6 and 11 may be performed by a programmable control device executing instructions organized into a program module. A programmable control device may be a computer processor or a custom designed state machine. Custom designed state machines may be embodied in a hardware device such as a printed circuit board comprising discrete logic, integrated circuits, or specially designed application specific integrated circuits (ASICs). Storage devices suitable for tangibly embodying program instructions include all forms of non-volatile memory including, but not limited to: semiconductor memory devices such as EPROM, EEPROM, and flash devices; magnetic disks (fixed, floppy, and removable); other magnetic media such as tape; and optical media such as CD-ROM disks.

What is claimed is:

1. A method to identify regions of functional and dysfunctional storage locations a memory device comprising:

identifying a first functional storage location in a memory device, the first functional storage location having a first address;

identifying a first dysfunctional storage location in the memory device, the first dysfunctional storage location having a second address;

storing a first tag at the first address, the first tag including a first pattern portion and a first length portion, the first length portion indicating a storage location immediately preceding the second address;

sequentially retrieving values from storage locations beginning immediately after the second address until a specified number of sequential functional storage locations are detected;

identifying a second dysfunctional storage location as that storage location immediately prior to the first of the specified number of sequential functional storage locations, the second dysfunctional storage location having a third address; and storing a second tag before the second address, the second tag including a second pattern portion and a second length portion, the second length portion indicating a storage location immediately after the third address.

2. The method of claim 1, wherein storing the first tag comprises storing the first tag that indicates a functional storage location immediately preceding the second address, and wherein storing the second tag comprises storing the second tag that indicates a functional storage location immediately after the third address.

3. A method to identify a dysfunctional storage location in a memory device comprising:

identifying a first dysfunctional storage location in a memory device, the first dysfunctional storage location having a first address;

identifying a second dysfunctional storage location in the memory device, the second dysfunctional storage location having a second address, wherein a first dysfunctional memory region having a length is between the first address and the second address; and storing a first tag before the first address, the first tag containing an offset value based on the length to indicate a functional storage location immediately after the second address.

4. The method of claim 2, wherein the act of identifying a second dysfunctional storage location comprises:

sequentially retrieving values from storage locations beginning immediately after the first address until a specified number of sequential functional storage locations are detected; and identifying the second dysfunctional storage location as that storage location immediately prior to the first of the specified number of sequential functional storage locations.

5. The method of claim 2, wherein the first address and the second address are the same address.

6. The method of claim 3, wherein identifying the first dysfunctional storage location comprises writing data to and reading data from the first address, and wherein identifying the second dysfunctional storage location comprises writing data to and reading data from the second address.

7. The method of claim 1, further comprising identifying third and fourth dysfunctional storage locations having respective third and fourth addresses in the memory device, wherein a second dysfunctional memory region having a second length is between the third and fourth addresses, the second length different from the length of the first dysfunctional memory region.

8. The method of claim 7, wherein the memory device has plural predefined memory blocks each having a third length, each of the first and second dysfunctional memory regions having a length less than the third length of the memory blocks.

9. The method of claim 3, wherein storing the first tag comprises storing a first tag that further contains a pattern portion to identify the first tag.

10. A method to identify a dysfunctional storage location in a memory device comprising:

identifying a first dysfunctional storage location in a memory device, the first dysfunctional storage location having a first address;

identifying a second dysfunctional storage location in the memory device, the second dysfunctional storage location having a second address; and storing a first tag before the first address, the first tag indicating a storage location immediately after the second address, wherein the first tag further comprises a pattern portion to identify the first tag.

11. The method of claim 10, wherein storing the first tag comprises storing the first tag that indicates a functional storage location immediately after the second address.

12. A method to identify a dysfunctional storage location in a memory device comprising:

identifying a first dysfunctional storage location in a memory device, the first dysfunctional storage location having a first address;

identifying a second dysfunctional storage location in the memory device, the second dysfunctional storage location having a second address;

storing a first tag before the first address, the first tag indicating a functional storage location immediately after the second address;

identifying a first functional storage location in the memory device, the first functional storage location having a third address; and storing a second tag at the third address, the second tag indicating a functional storage location immediately preceding the first address.

13. The method of claim 12, wherein the second tag further comprises a pattern portion to identify the second tag.

14. A program storage device, readable by a programmable control device, comprising:

instructions stored on the program storage device for causing the programmable control device to identify a first dysfunctional storage location in a memory device, the first dysfunctional storage location having a first address;

identify a second dysfunctional storage location in the memory device, the second dysfunctional storage location having a second address, wherein a first dysfunctional memory region having a length is between the first address and second address; and store a first tag before the first address, the first tag containing an offset value based on the length to indicate a functional storage location immediately after the second address.

15. The program storage device of claim 14, wherein the instructions to identify a second dysfunctional storage location comprise instructions to:

retrieve values sequentially from storage locations beginning immediately after the first address until a specified number of sequential functional storage locations are detected; and identify the second dysfunctional storage location as that storage location immediately prior to the first of the specified number of sequential functional storage locations.

16. The program storage device of claim 14, wherein the memory device comprises a random access memory device.

17. The program storage device of claim 16, wherein the random access memory device comprises an audio random access memory device.

18. The program storage device of claim 14, wherein the memory device comprises a video storage device.

19. The program storage device of claim 14, wherein the instructions comprise instructions for causing the programmable control device to further identify third and fourth dysfunctional storage locations having respective third and fourth addresses in the memory device, which a second dysfunctional memory region having a second length is between the third and fourth addresses, the second length being different from the length of the first dysfunctional memory region.

20. The program storage device of claim 14, wherein the first tag further contains a pattern portion to identify the first tag.

21. A program storage device, readable by a programmable control device, comprising:

instructions stored on the program storage device for causing the programmable control device to identify a first dysfunctional storage location in a memory device, the first dysfunctional storage location having a first address;

identify a second dysfunctional storage location in the memory device, the second dysfunctional storage location having a second address;

store a first tag before the first address, the first tag indicating a functional storage location immediately after the second address;

identify a first functional storage location in the memory device, the first functional storage location having a third address; and store a second tag at the third address, the second tag indicating a functional storage location immediately preceding the first address.

22. The program storage device of claim 21, wherein the instructions to store a second tag comprise instructions to instructions to store a pattern in the second tag to identify the second tag.

23. A system comprising:

a memory having a plurality of predefined blocks each having a first size; and a memory interface adapted to identify a region of dysfunctional storage locations in the memory, the region having a size smaller than the first size, the memory interface adapted to further store a first tag to indicate a functional storage location after the region of dysfunctional storage locations.

24. The system of claim 23, wherein the first tag has an offset value to indicate the functional storage location positioned immediately after the region.

25. The system of claim 24, wherein the first tag has a predetermined pattern to identify the first tag.

26. The system of claim 23, wherein identifying the region comprises writing data and reading data for each storage location in the region to perform data matching.

27. The system of claim 23, wherein the memory interface is adapted to further store a second tag to indicate a length of a functional storage region before the region of dysfunctional storage locations.

28. The system of claim 27, wherein the memory interface is adapted to store the first and second tags in the memory.

29. The system of claim 27, wherein the first tag is located at a storage location preceding the region of dysfunctional storage locations, and wherein the second tag is located at a storage location preceding the functional storage region.

30. A system comprising:

a memory; and a memory interface adapted to store a first tag and a second tag in the memory, the first tag containing an offset value to identify a functional storage location after a dysfunctional region of a first length in the memory, and the second tag containing another offset value to identify a functional storage location after a second dysfunctional region of a second length in the memory, the first length different from the second length.

31. The system of claim 30, wherein the first tag further contains a pattern portion to identify the tag.

* * * * *

UNITED STATES PATENT AND TRADEMARK OFFICE
CERTIFICATE OF CORRECTION

PATENT NO.   : 6,496,876 B1                                               Page 1 of 1
DATED        : December 17, 2002
INVENTOR(S)  : Paul W. Rohwer It is certified that error appears in the above-identified patent and that said Letters Patent is hereby corrected as shown below:

<u>Column 7,</u>
Line 7, "2" should be -- 3 --;
Line 17, "2" should be -- 3 --;
Line 24, "1" should be -- 3 --.

Signed and Sealed this

Twenty-second Day of April, 2003

JAMES E. ROGAN
*Director of the United States Patent and Trademark Office*